United States Patent
Chang et al.

(10) Patent No.: US 12,165,867 B2
(45) Date of Patent: *Dec. 10, 2024

(54) METHOD FOR REDUCING CHARGING OF SEMICONDUCTOR WAFERS

(71) Applicant: TAIWAN SEMICONDUCTOR MANUFACTURING COMPANY, LTD., Hsinchu (TW)

(72) Inventors: Wei-Lin Chang, Hsinchu (TW); Chih-Chien Wang, Hsinchu (TW); Chihy-Yuan Cheng, Hsinchu (TW); Sz-Fan Chen, Hsinchu (TW); Chien-Hung Lin, Hsinchu (TW); Chun-Chang Chen, Hsinchu (TW); Ching-Sen Kuo, Hsinchu (TW); Feng-Jia Shiu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/225,576

(22) Filed: Jul. 24, 2023

(65) Prior Publication Data
US 2023/0386820 A1    Nov. 30, 2023

Related U.S. Application Data

(63) Continuation of application No. 17/206,908, filed on Mar. 19, 2021, now Pat. No. 11,769,662.

(51) Int. Cl.
*H01L 21/02*    (2006.01)
*H01L 21/027*    (2006.01)

(52) U.S. Cl.
CPC ...... *H01L 21/0206* (2013.01); *H01L 21/0277* (2013.01)

(58) Field of Classification Search
CPC ............ H01L 21/0206; H01L 21/0277; H01L 21/02057; H01L 21/02082; H01L 21/0271; H01L 21/0337
See application file for complete search history.

(56) References Cited

U.S. PATENT DOCUMENTS 4,655,162 A * 4/1987 Kameyama ......... H01L 21/6715
                                                                118/54
11,209,736 B2   12/2021 Hsu et al.
(Continued)

FOREIGN PATENT DOCUMENTS

CN    111105992 A    5/2020
TW    201843707 A    12/2018

OTHER PUBLICATIONS

Notice of Allowance issued in U.S. Appl. No. 17/206,908, dated May 17, 2023.

(Continued)

*Primary Examiner* — Erin F Bergner
(74) *Attorney, Agent, or Firm* — STUDEBAKER & BRACKETT PC

(57) ABSTRACT

Embodiments are directed to a method for minimizing electrostatic charges in a semiconductor substrate. The method includes depositing photoresist on a semiconductor substrate to form a photoresist layer on the semiconductor substrate. The photoresist layer is exposed to radiation. The photoresist layer is developed using a developer solution. The semiconductor substrate is cleaned with a first cleaning liquid to wash the developer solution from the photoresist layer. A tetramethylammonium hydroxide (TMAH) solution is applied to the semiconductor substrate to reduce charges accumulated in the semiconductor substrate.

20 Claims, 10 Drawing Sheets

(56) References Cited

U.S. PATENT DOCUMENTS

| | | |
|---|---|---|
| 11,521,865 B2 | 12/2022 | Tsujikawa et al. |
| 11,769,662 B2 * | 9/2023 | Chang ................. H01L 21/0277 134/1.3 |
| 2001/0018168 A1 | 8/2001 | Kosa et al. |
| 2002/0090575 A1 | 7/2002 | Chiu |
| 2002/0189639 A1 | 12/2002 | Aoki et al. |
| 2005/0233921 A1 | 10/2005 | Lee et al. |
| 2009/0056744 A1 | 3/2009 | Carswell |
| 2018/0039182 A1 | 2/2018 | Zi et al. |

OTHER PUBLICATIONS

Non-Final Office Action issued in U.S. Appl. No. 17/206,908, dated Dec. 29, 2022.

* cited by examiner

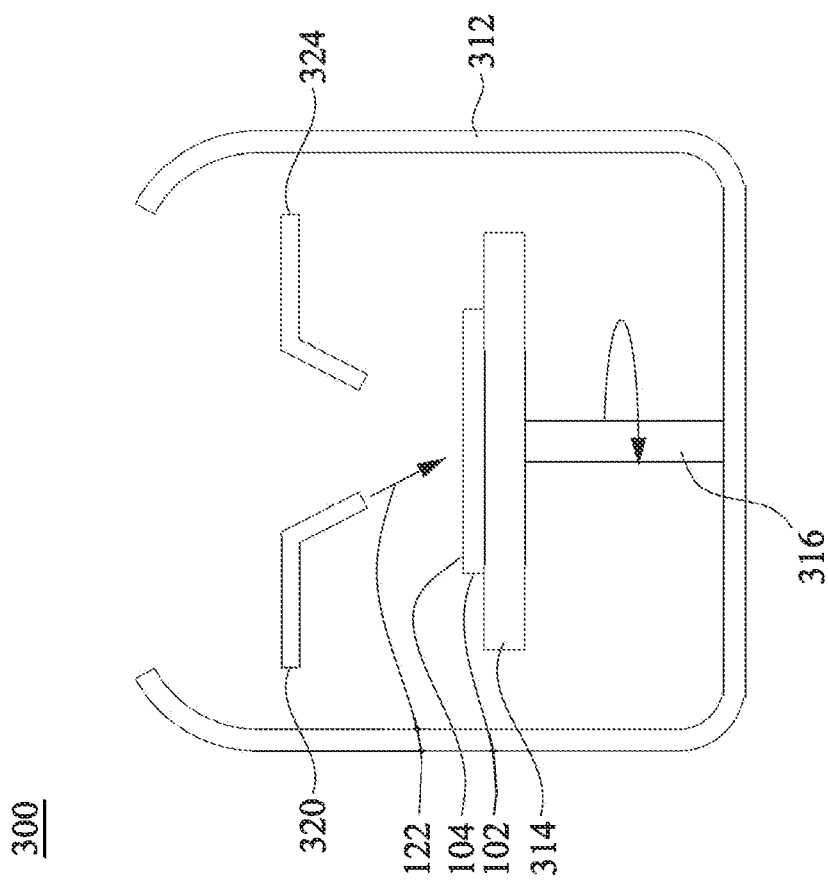

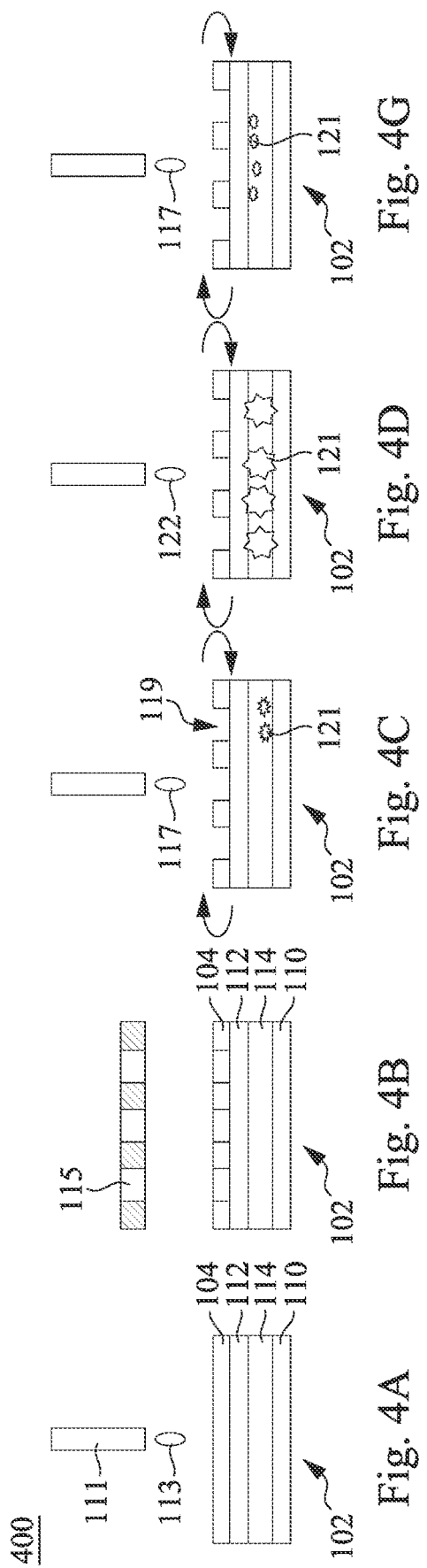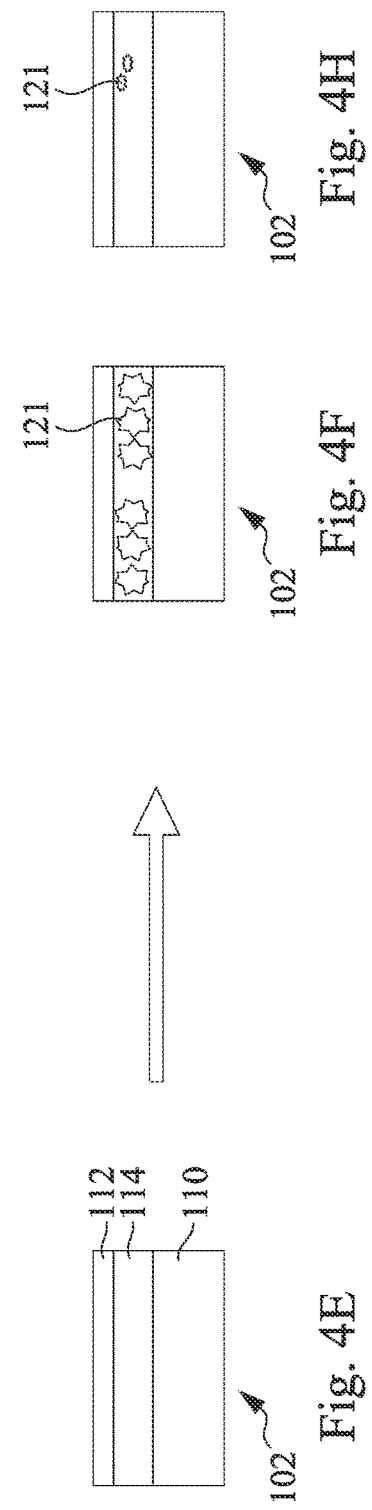

METHOD FOR REDUCING CHARGING OF SEMICONDUCTOR WAFERS

CROSS REFERENCE TO RELATED APPLICATION

This application is a continuation application and claims priority under 35 U.S.C. § 120 to U.S. non-provisional application Ser. No. 17/206,908 filed Mar. 19, 2021, the entire contents of which are incorporated herein by reference.

BACKGROUND

Lithography is used for patterning the surface of a wafer that is covered by a resist material. The resist material is patterned so that portions of the resist material can be selectively removed to expose underlying areas of the wafer for selective processing such as etching, material deposition, implantation and the like. Photolithography utilizes light energy beams, including ultraviolet light or X-ray, for selective exposure of the resist material. Alternatively, charged particle beams, e.g., electron beams and ion beams, have been used for high resolution lithographic resist exposure.

During an integrated circuit (IC) design, a number of layout patterns of the IC, for different steps of IC processing, are generated. The layout patterns include geometric shapes corresponding to structures to be fabricated on a wafer. The layout patterns may be patterns on a mask that are projected, e.g., imaged, on a resist layer on the wafer to create the IC. A lithography process transfers the pattern of the mask to the resist layer of the wafer such that etching, implantation, or other steps are applied only to predefined regions of the wafer. The resist material is a critical component of lithographic processing. To maintain a high device yield, the resist material coated on a wafer should be free of impurities and defects such as crystallized impurities.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 is a schematic view of a spin-rinse-dry (SRD) apparatus for rinsing the semiconductor substrate in FIG. 1.

FIGS. 4A, 4B, 4C, 4D, and 4G illustrate different operations in a method of fabricating a semiconductor device according to embodiments of the disclosure.

FIGS. 4E, 4F, and 4H illustrate accumulation of charges in the semiconductor substrate in FIGS. 4A-4D.

DETAILED DESCRIPTION

Figure 1:
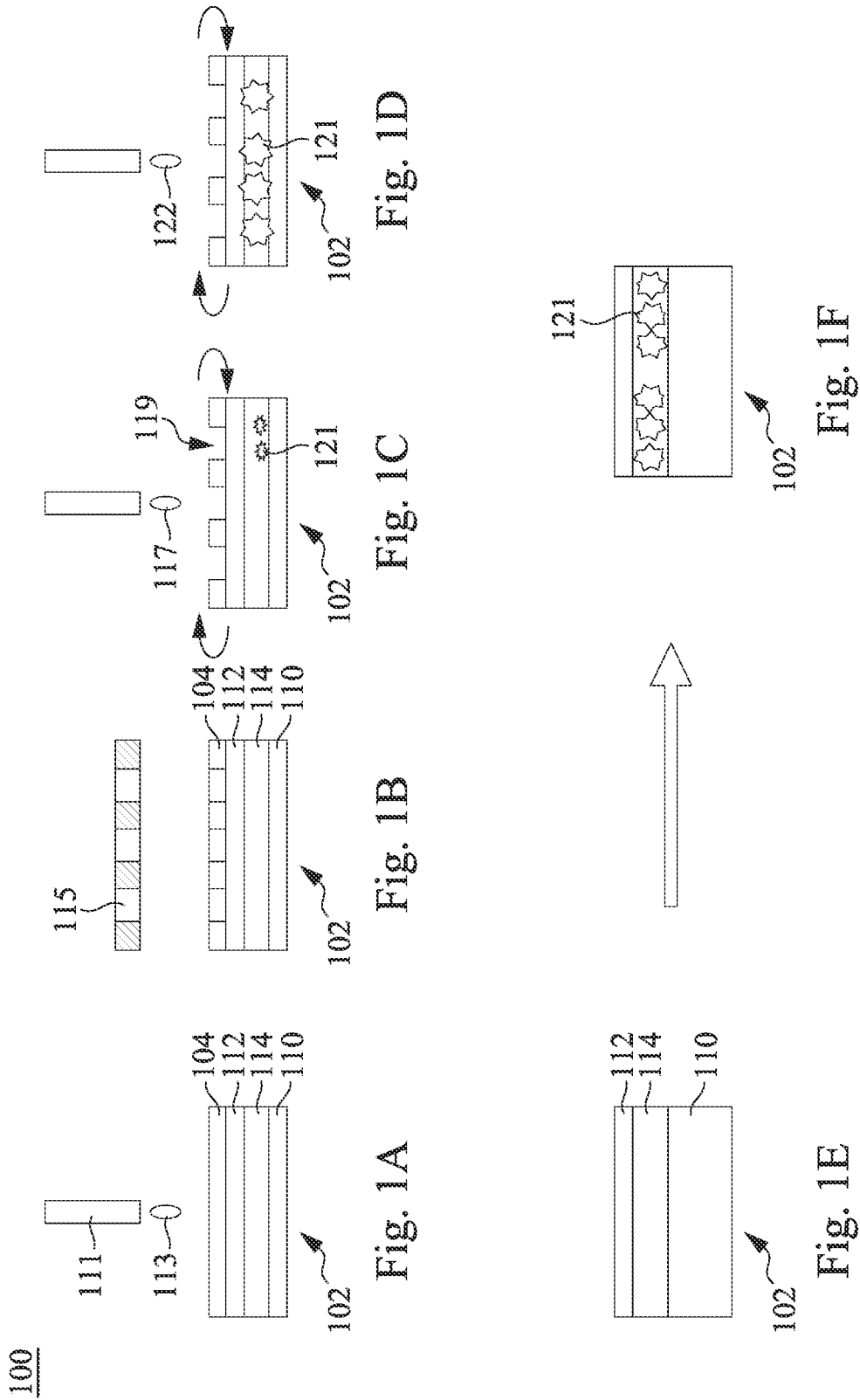
FIGS. 1A, 1B, 1C, and 1D illustrate different operations in a method of fabricating a semiconductor device.
FIGS. 1E and 1F illustrate accumulation of charges in the semiconductor substrate in FIGS. 1A-1D.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Embodiments disclosed are directed to a method for reducing accumulation of electrostatic charges on semiconductor wafers (substrate) during spin-rinse-drying of the wafers in the fabrication of integrated circuits (ICs). More specifically, embodiments are directed to rinsing (or cleaning, dipping, etc.) operations performed on a silicon-on-insulator (SOI) wafer using tetramethylammonium hydroxide (TMAH) solution after a development operation has been performed on the SOI wafer and the developer used in the development operation has been rinsed from the SOI wafer. According to embodiments, the wafer is initially rinsed using deionized (DI) water after a development of photoresist to rinse off photoresist from the development operation and the wafer is then spin dried to remove. A tetramethylammonium hydroxide (TMAH) solution is then applied to the wafer, which is then subjected to a spin-drying operation. During the spin-drying operation, the TMAH solution reduces charges (e.g., electrostatic charges) that have built up in the SOI wafer during the prior processing operations and minimizes the charges on the rotating SOI wafer. By reducing the charges, electrostatic interference with processing equipment during photolithographic and other fabrication processes is substantially reduced.

Embodiments of the present disclosure are implemented during a photolithography process to reduce accumulation of electrostatic charges on wafers during a development of photoresist and a spin-dry operation of wafer cleaning. The method according to embodiments of the disclosure is performed for reducing the electrostatic charges that accumulate on a wafer when spinning the wafer during the development of the photoresist and when the wafer undergoes a spin-rinse-drying operation after development of photoresist. However, embodiments are not limited in this regard, and the method according to embodiments disclosed herein is equally adaptable to reducing the accumulation of electrostatic charges on wafers during a spin-rinse-dry operation in areas of semiconductor processing not limited to photolithography.

FIGS. 1A-1D illustrate different operations in a method 100 of fabricating a semiconductor device. FIGS. 1E and 1F illustrate accumulation of charges in the semiconductor substrate 102. As illustrated, in FIG. 1A, photoresist material 113 is deposited, e.g., coated, on a top surface of a semiconductor substrate 102 to form a photoresist layer 104. The semiconductor substrate 102 has a semiconductor-on-insulator structure including an insulating layer 114 disposed between a first silicon layer 110 and a second silicon layer 112. In some other embodiments, the substrate may alternatively or additionally include other suitable semiconductor material, such as germanium (Ge), silicon germanium (SiGe), silicon carbide (SiC), gallium arsenic (GaAs), diamond, indium arsenide (InAs), indium phosphide (InP), silicon germanium carbide (SiGeC), and gallium indium phosphide (GaInP). The substrate may also include various features such as various doped regions, shallow trench isolation (STI) regions, source/drain features, gate stacks, dielectric features, and/or multilevel interconnects.

The insulating layer 114 is a buried oxide layer including silicon dioxide ($SiO_2$). The insulating layer 114 is formed to a thickness of between about 100 nm and about 200 nm. The insulating layer 114 can be deposited or thermally grown in the substrate. Alternatively, the insulating layer 114 is formed by implanting an oxygen bearing species into the substrate, e.g., using a SIMOX process. As discussed elsewhere in this document, electrostatic charges are developed in the semiconductor substrate 102 during operations in the photolithographic process. Due to the presence of the insulating layer 114, the electrostatic charges are prevented from being discharged from the semiconductor substrate 102 and thereby accumulate in the semiconductor substrate 102.

The photoresist material 113 for forming the photoresist layer 104 is provided from a dispensing nozzle 111 that transfers the photoresist material 113 from a resist supply. The photoresist layer 104 is either a positive tone resist or a negative tone resist. A positive tone resist refers to a resist material that when exposed to the charged particle beam or the actinic radiation (typically UV light, e.g., EUV) becomes soluble in a developer, while the region of the resist that is non-exposed (or exposed less) is insoluble in the developer, leaving behind a coating in areas that were not exposed. A negative tone resist, on the other hand, refers to a resist material that when exposed to the charged particle beam or the actinic radiation becomes insoluble in the developer, while the region of the resist that is non-exposed (or exposed less) is soluble in the developer.

In FIG. 1B, the photoresist layer 104 on the semiconductor substrate 102 is exposed to a radiation beam thereby patterning the photoresist layer 104. The radiation beam is applied to the photoresist layer 104 deposited on the semiconductor substrate 102 using a lithography system that provides a pattern of the radiation using a patterning device 115 (e.g., photomask or reticle) according to an IC design layout. In one embodiment, a lithography system includes an ultraviolet (UV) radiation, a deep ultraviolet (DUV) radiation, an extreme ultraviolet (EUV) radiation, an X-ray radiation, and/or other suitable radiation types. In alternative embodiments, a lithography system includes a charged particle lithography system, such as an electron beam or an ion beam lithography system. As mentioned above, when the photoresist layer 104 is a positive tone resist, the exposed portions of the photoresist layer 104 become soluble in a developer and the portions of the photoresist layer 104 that are non-exposed (or exposed less) are insoluble in the developer. Alternatively, when the photoresist layer 104 is a negative tone resist, the exposed portions of the photoresist layer 104 become insoluble in the developer, while portions of the photoresist layer 104 that are non-exposed (or exposed less) are soluble in the developer.

In some embodiments, a thermal treatment process is performed on the semiconductor substrate 102 having the patterned photoresist layer 104. The thermal treatment is referred to as a post-baking process, or a post-exposure baking (PEB) process. During the post-baking process, the semiconductor substrate 102 having the patterned photoresist layer 104 is heated to an elevated baking temperature using a suitable baking mechanism, such as a hotplate or an oven. In one embodiment, the baking is performed at a temperature ranging between 100° C. and 250° C. Alternatively, other suitable baking temperatures may be used.

In FIG. 1C, the patterned photoresist layer 104 is developed for creating a circuit pattern in the photoresist layer 104. A developer 117 is applied to the patterned photoresist layer 104 to form a circuit pattern 119 on the semiconductor substrate 102. Assuming the photoresist layer 104 is a negative photoresist layer being developed by a negative tone developer, the developer selectively dissolves and removes areas that received no exposure dose of the radiation (or an exposure dose below a predetermined threshold exposure dose value). In some embodiments, the developer 117 includes an alkaline aqueous solution, such as tetramethylammonium hydroxide (TMAH).

Applying the developer 117 includes spraying the developer 117 on the patterned photoresist layer 104, for example by a spin-on process. In an embodiment, the developer 117 removes the non-exposed regions of the photoresist layer 104 leaving the portions have been exposed. In other embodiments, the patterned photoresist layer 104 is a positive photoresist layer being developed by a positive tone developer that selectively dissolves and removes areas of the photoresist layer 104 that received an exposure dose (or an exposure dose at or above a predetermined threshold exposure dose value). Developing the photoresist creates patterns of islands and windows, which correspond to the trenches, vias and other openings that together define the pattern of the circuit devices to be formed on the semiconductor substrate 102.

As illustrated in FIG. 1C, spinning the semiconductor substrate 102 during the development of the photoresist layer 104 generates charges 121 in the semiconductor substrate 102. Because of the presence of the insulating layer 114, these charges 121 cannot be discharged from the semiconductor substrate 102 and accumulate in the insulating layer 114.

In FIG. 1D, after development of the photoresist layer 104 on the semiconductor substrate 102 is completed, the semiconductor substrate 102 is subjected to a rinsing operation, to remove photoresist from the semiconductor substrate 102. In some embodiments, this operation is carried out in a spin-rinse-dry apparatus (e.g., spin-rinse-dry apparatus 300, FIG. 3). During the photoresist layer 104 rinsing operation, deionized (DI) water 122 is ejected onto the photoresist layer 104 on the semiconductor substrate 102. Simultaneously, the semiconductor substrate 102 is rotated at a predetermined rotational speed, which is typically between about 200 RPM and about 2,000 RPM. The DI water 122 strikes the semiconductor substrate 102 (e.g., in a center thereof) and is drawn outwardly by centrifugal force toward the edge of the semiconductor substrate 102, washing residual photoresist particles from the photoresist layer 104.

As illustrated in FIG. 1D, the spinning action at the relatively high spin speed when washing with DI water 122 increases the charges 121 in the semiconductor substrate 102, and the charges 121 accumulate in the insulating layer 114. As a comparison, FIG. 1E illustrates the semiconductor substrate 102 with no charge accumulation, while FIG. 1F illustrates the semiconductor substrate 102 including an increased charge accumulation. The charges 121 degrade performance of a semiconductor device manufactured from the semiconductor substrate 102. In instances, the charges measure around −50V.

Figure 2:
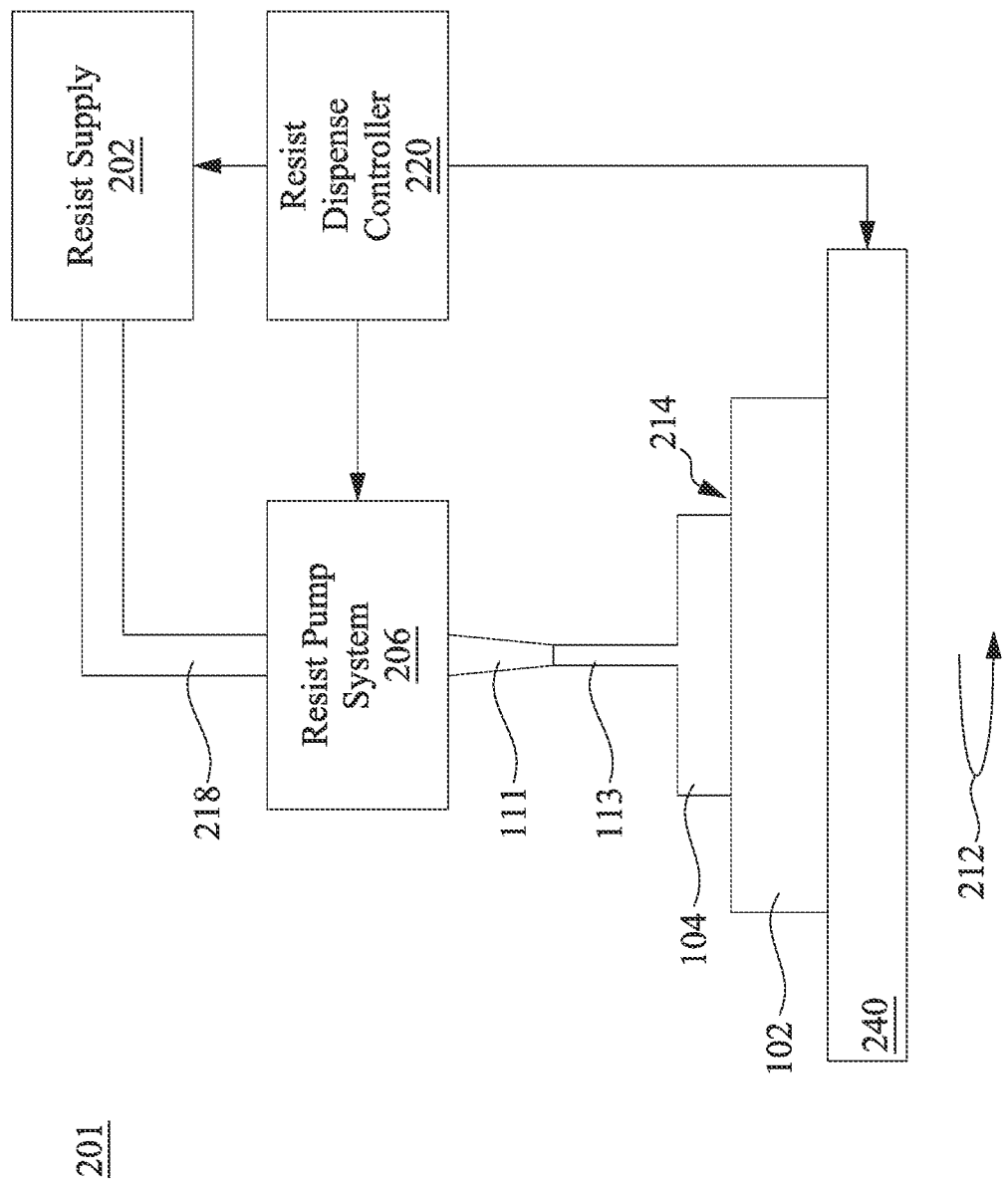
FIG. 2 illustrates a photoresist dispensing system for dispensing a photoresist layer.

FIG. 2 illustrates a photoresist dispensing system 201 for dispensing photoresist layer 104 on a top surface of the semiconductor substrate 102. The photoresist material 113 is coated (e.g., spin coated) on the top surface of the semiconductor substrate 102 to form the photoresist layer 104. The photoresist material 113 is dispensed from a photoresist dispensing nozzle 111. In some embodiments, a photoresist dispense controller 220 is coupled to a photoresist pump system 206 to control a thickness of the photoresist layer 104 that is produced on the semiconductor substrate 102. The photoresist pump system 206 is coupled to the photoresist dispensing nozzle 111 and transfers the photoresist material 113 from a photoresist supply 202, via a pipe 218 (e.g., a conduit, or a tube), to the photoresist dispensing nozzle 111. In some embodiments, the semiconductor substrate 102 is placed on a stage (or chuck) 240 and the stage 240 rotates in a rotation direction 212 to uniformly distribute the photoresist material 113 on the semiconductor substrate 102. In some embodiments, the stage 240 rotates at a rotational speed, which is typically between about 500 RPM to about 5500 RPM depending on a thickness of the photoresist film desired on the semiconductor substrate 102. In some embodiments, a protection segment is coated in an edge region 214 around an edge of the semiconductor substrate 102 to limit the photoresist material 113 from spilling over the edge of the semiconductor substrate 102. In some embodiments, the photoresist dispense controller 220 is also coupled to a stage controller in the stage 240 to synchronize the dispensing of the photoresist material 113 and the rotation of the semiconductor substrate 102. In some embodiments, the semiconductor substrate 102 is used for manufacturing a semiconductor device and, thus, includes one or more layers of the semiconductor device below the photoresist layer 104. In some embodiments, the stage 240 rotates around a direction opposite to the rotation direction 212.

In some embodiments, the photoresist layer 104 is a photosensitive layer that is patterned by exposure to actinic radiation. In some embodiments, the photoresist layer 104 is sensitive to charged particles and the photoresist layer 104 is patterned by exposure to a charged particle beam, e.g., an electron beam. The chemical properties of the resist regions struck by actinic radiation or the charged particle beam may change in a manner that depends on the type of resist used. The photoresist layer 104 is either a positive tone resist or a negative tone resist.

FIG. 3 is a schematic view of a spin-rinse-dry (SRD) apparatus 300 for rinsing the semiconductor substrate 102 to remove photoresist from the semiconductor substrate 102. After development of the photoresist layer 104 on the semiconductor substrate 102 is completed, the semiconductor substrate 102 is subjected to a rinsing operation, as discussed above, to remove photoresist particles from the semiconductor substrate 102. The rinsing operation is carried out using the spin-rinse-dry (SRD) apparatus 300. The spin-rinse-dry (SRD) apparatus 300 includes a cup-shaped chamber 312 within which is provided a wafer support 314 on a shaft 316. The semiconductor substrate 102 is supported on the wafer support 314, and dispensing arms 320, 324 are positioned over the semiconductor substrate 102.

During the rinsing operation, deionized (DI) water 122 is ejected from a dispensing arm 320 and onto the photoresist layer 104 on the semiconductor substrate 102. Simultaneously, the wafer support 314 rotates the semiconductor substrate 102 at a predetermined rotational speed. The deionized (DI) water 122 strikes the semiconductor substrate 102 and is drawn outwardly by centrifugal force toward the edge of the semiconductor substrate 102, washing residual photoresist particles from the photoresist layer 104. The spin-rinse-dry (SRD) apparatus 300 also includes one or more additional dispensing arms, for example, dispensing arm 324 that can be used to dispense other fluids, for example, the developer 117, or other solutions such as, cleaning agents on the semiconductor substrate 102.

FIGS. 4A-4D and 4G illustrate different operations in a method 400 of fabricating a semiconductor device, according to embodiments of the disclosure. FIGS. 4E, 4F, and 4H illustrate accumulation of charges in the semiconductor substrate 102. FIGS. 4A-4F are similar to the operations in FIGS. 1A-1F, and therefore may be best understood with reference thereto where like numerals designate like components not described again in detail.

In order to reduce the accumulated charges 121, as illustrated in FIG. 4G, the photoresist layer 104 of the semiconductor substrate 102 is again applied with the developer 117. In some embodiments, the developer 117 is a 2.38% tetramethylammonium hydroxide (TMAH) solution. The high conductivity 2.38% TMAH solution short circuits the charges 121. For instance, the charges 121 accumulate near the surface and the high conductivity 2.38% TMAH solution short circuits the charges 121.

In some embodiments, the operation is performed in a spin-rise-dry apparatus (e.g., spin-rinse-dry apparatus 300, FIG. 3) by dispensing the developer 117 onto the photoresist layer 104 as the semiconductor substrate 102 is rotated. In some embodiments, the semiconductor substrate 102 in FIG. 4G is rotated at a rotational speed that is different from a rotational speed of the semiconductor substrate 102 when spin-drying the semiconductor substrate 102 after cleaning the semiconductor substrate 102 using deionized (DI) water 112 to wash residual developer solution 117 from the photoresist layer 104 (FIG. 4D). In some embodiments, the semiconductor substrate 102 is rotated at a rotational speed of about 50 RPM for about 5 seconds. In some embodiments, the semiconductor substrate 102 is rotated at a rotational speed of about 50 RPM for about 10 seconds. In some embodiments, the semiconductor substrate 102 is rotated at a rotational speed of about 50 RPM for about 15 seconds. In some embodiments, the semiconductor substrate 102 is rotated at a rotational speed of about 500 RPM for about 5 seconds. In some embodiments, the semiconductor substrate 102 is rotated at a rotational speed of about 500 RPM for about 10 seconds. In some embodiments, the semiconductor substrate 102 is rotated at a rotational speed of about 500 RPM for about 15 seconds. In some embodiments, the semiconductor substrate 102 is rotated at a rotational speed of about 1000 RPM for about 5 seconds. In some embodiments, the semiconductor substrate 102 is rotated at a rotational speed of about 1000 RPM for about 10 seconds. In some embodiments, the semiconductor substrate 102 is rotated at a rotational speed of about 1000 RPM for about 15 seconds. The developer solution 117 is dispensed onto the photoresist layer 104 at the center of the semiconductor substrate 102, such that the developer solution 117 is drawn from the center to the edges of the semiconductor substrate 102, over the surface of the photoresist layer 104. The developer solution 117 is dispensed onto the photoresist layer 104 until the developer solution 117 substantially covers the entire surface of the photoresist layer 104. As the semiconductor substrate 102 is rotated, the developer solution 117 reduces electrostatic charges 121 in the insulating layer 114. This charge-reducing action therefore minimizes accumulation of electrostatic charges in the semiconductor substrate 102 which would otherwise induce defects in the devices formed on the semiconductor substrate 102 and interfere with proper operation of processing equipment used in the ensuing post-development photolithography and other semiconductor fabrication steps.

As illustrated in FIG. 4H, the additional rinsing operation using the developer 117 substantially reduces the electrostatic charges 121 accumulated in the semiconductor substrate 102.

In some embodiments, after rinsing the semiconductor substrate 102 with the developer solution 117, an additional rinsing operation is performed on the semiconductor substrate 102 using deionized (DI) water 112 to wash residual developer solution 117 from the photoresist layer 104. This operation includes rotating the semiconductor substrate 102 at a relatively reduced speed (for example, about 50 RPM) and for a relatively shorter time duration (for example, about 10 second) compared to the prior DI water rinsing operations (FIG. 4D). Because the semiconductor substrate 102 is spun at a lower speed than during the prior DI water rinsing operations (FIG. 4D), the charges that accumulate during the additional rinsing operation are significantly smaller. The photoresist layer 104 is then dried by continuing to rotate the semiconductor substrate 102 until the DI water is dried (spin-dry) from the photoresist layer 104.

Figure 5:
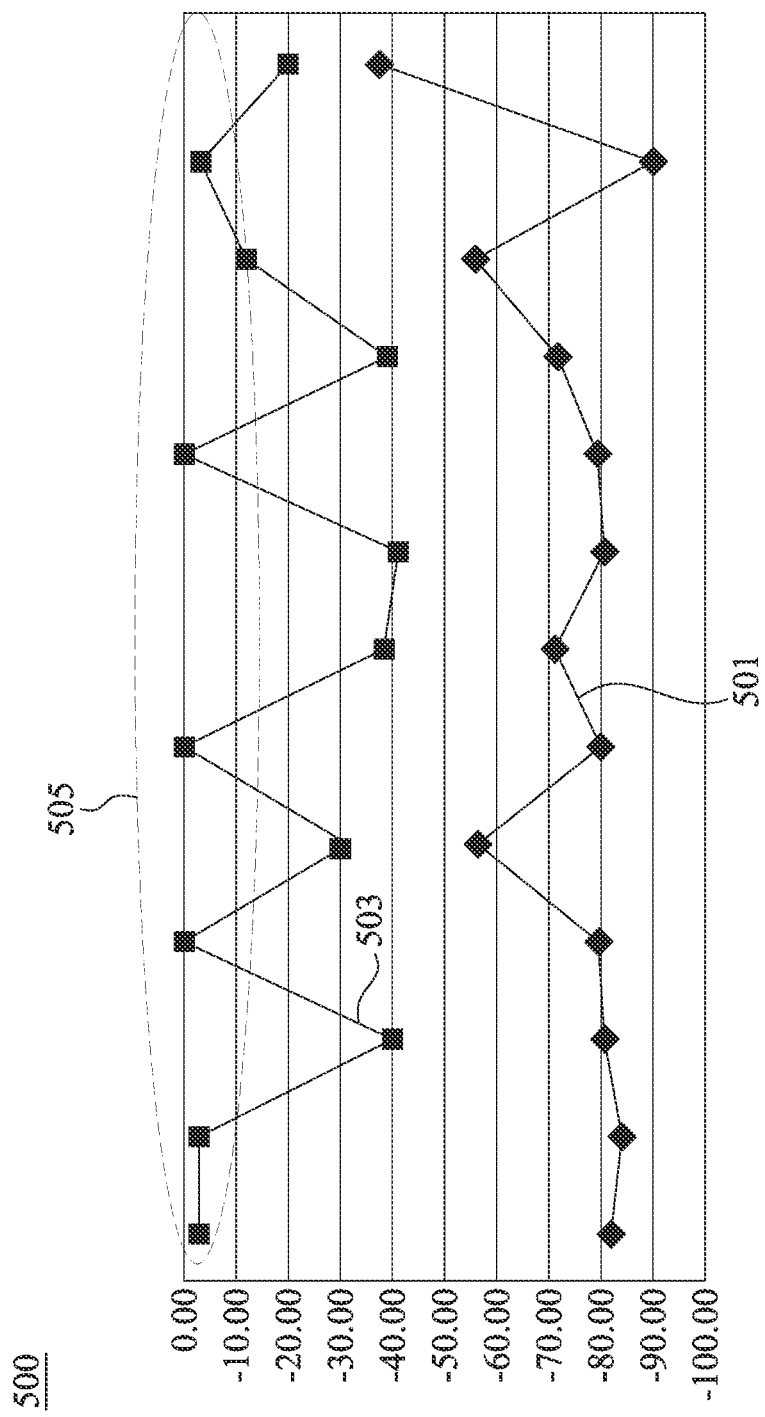
FIG. 5 is a graph that illustrates the amount of electrostatic charges present in the semiconductor substrate in FIG. 1 before and after the additional rinsing operation using the developer.

FIG. 5 is a graph 500 that illustrates the amount of electrostatic charges 121 present in the semiconductor substrate 102 before and after the additional rinsing operation using the developer 117. The trace 501 indicates the amount of electrostatic charges 121 without the additional rinsing operation as shown in FIGS. 1A-1D. The horizontal axis shows wafer numbers processed. In other words, the trace 501 indicates the amount of electrostatic charges 121 accumulating after rinsing the semiconductor substrate 102 to remove photoresist particles remaining after development of the photoresist layer 104. As illustrated, the amount of electrostatic charges 121 are greater than about −50V. The trace 503 indicates the amount of electrostatic charges 121 with the additional rinsing operation as shown in FIGS. 4A-4D and 4G. As illustrated by the encircled portion 505, electrostatic charges 121 less than about −5V are obtained after the additional rinsing operation. Thus, a substantial drop in the accumulated charges 121 is observed.

Figure 6B:
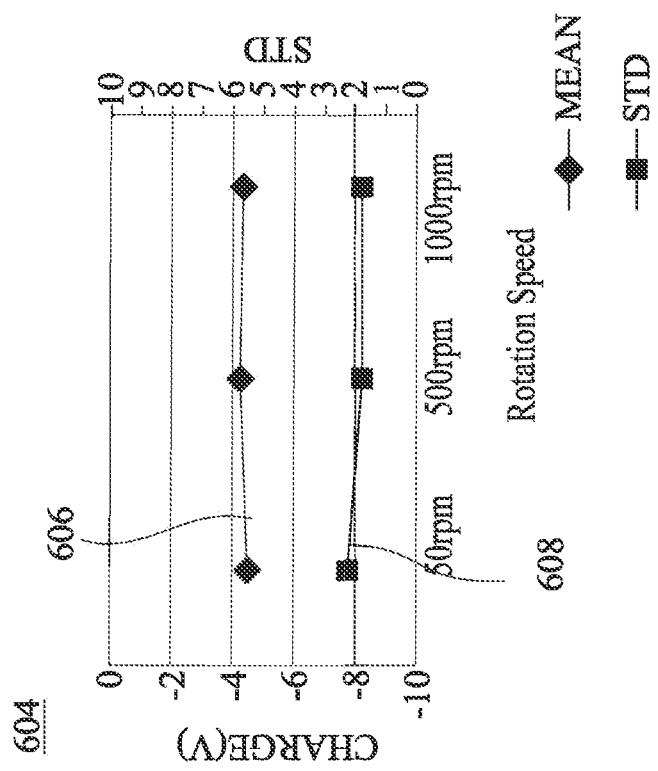
FIG. 6B is a graph that illustrates a variation in the amount of electrostatic charges due to variation in rotating speed (RPM) of the semiconductor substrate in FIG. 1.
Figure 6A:
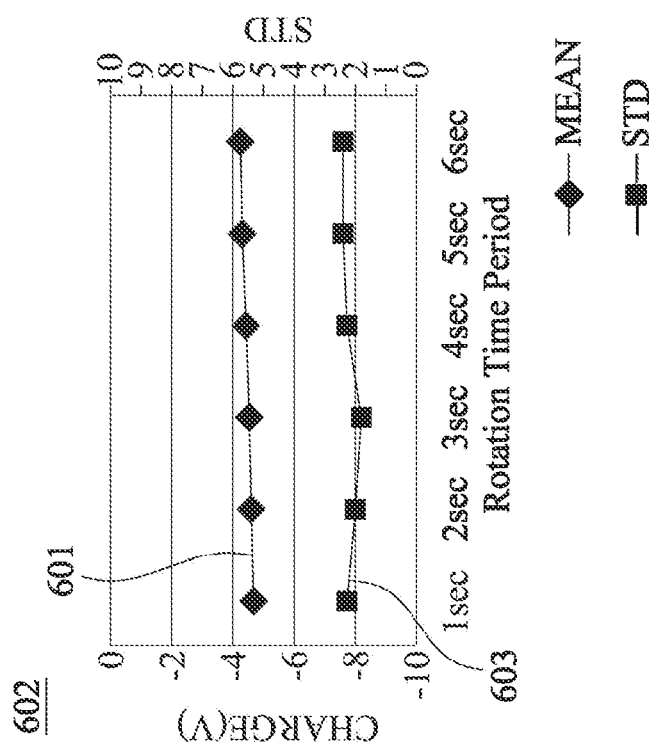
FIG. 6A is a graph that illustrates a variation in the amount of electrostatic charges due to variation in a rotation time period of the semiconductor substrate in FIG. 1.

FIG. 6A is a graph 602 that illustrates a variation in the amount of electrostatic charges 121 due to variation in a rotation time period of the semiconductor substrate 102 during the operation in FIG. 4G in which the semiconductor substrate is subjected to an additional tetramethylammonium hydroxide (TMAH) rising operation. The rotation time period is represented on the abscissa (horizontal axis), the amount of electrostatic charges 121 is represented on the left ordinate (vertical axis), and the standard deviation is represented on the right ordinate. The trace 601 indicates that the variation in the amount of the electrostatic charges 121 shows a slight increase when the time for which the semiconductor substrate 102 is rotated is increased. The trace 603 indicates a relatively small variation in the standard deviation.

FIG. 6B is a graph 604 that illustrates a variation in the amount of electrostatic charges 121 due to variation in rotating speed (rpm) of the semiconductor substrate 102 with the additional tetramethylammonium hydroxide (TMAH) rising operation. The rotation speed of the semiconductor substrate 102 is represented on the abscissa (horizontal axis), the amount of electrostatic charges 121 is represented on the left ordinate (vertical axis), and the standard deviation is represented on the right ordinate. The trace 606 indicates that the variation in the amount of the electrostatic charges 121 is relatively unchanged when the rotation speed of the semiconductor substrate 102 is increased. The trace 608 indicates a relative improvement in the standard deviation of the electrostatic charges.

The method according to embodiments of the disclosure offers numerous advantages over existing methods. For example, the method reduces the development time since the method can be performed on each layer when fabricating the semiconductor device. The method can be used in different semiconductor device fabrication tools. The development time and the spin speed can be optimized to obtain desired results. For instance, if required, instead of a longer development time, the spin speed of the semiconductor substrate during the rinsing operation (FIG. 4G) can be reduced.

In the foregoing embodiments, a TMAH aqueous solution is used for the additional rinsing operation. However, other solutions with a high electric conductivity (e.g., acidic or alkaline solutions) can be used. Further, the substrate (wafer) 102 is not necessarily an SOI wafer, but may be any other type of substrate with or without patterns. Moreover, the substrate 102 can be a glass or a quartz substrate for a photo mask or a flat panel display.

It will be understood that not all advantages have been necessarily discussed herein, no particular advantage is required for all embodiments or examples, and other embodiments or examples may offer different advantages.

Figure 7A:
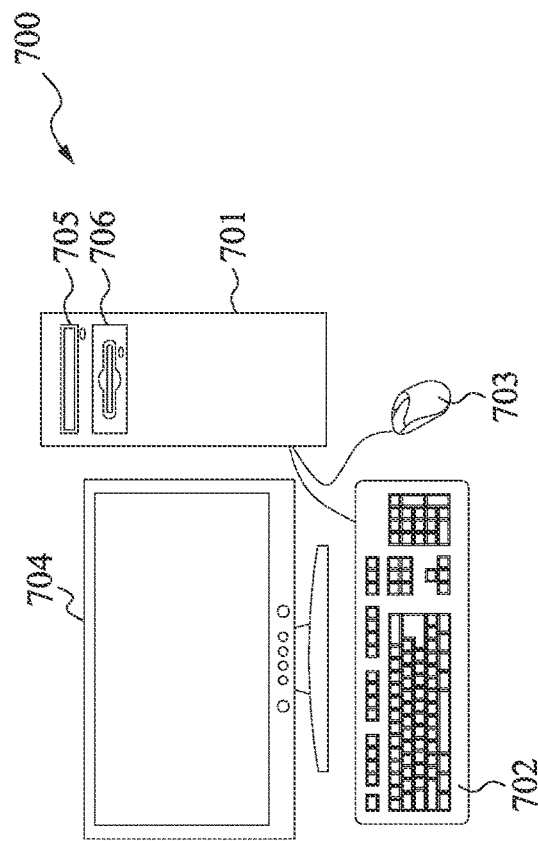
FIGS. 7A and 7B illustrates a computer system for controlling the photoresist dispense controller in FIG. 2, the rotation of the stage in FIG. 2, and/or the spin-rinse-dry (SRD)) apparatus in FIG. 3, according to an embodiment of the present disclosure.

FIG. 7A is a schematic view of a computer system 700 that performs the functions of an apparatus for controlling the photoresist dispense controller 220, the rotation of the stage 240, the spin-rinse-dry (SRD) apparatus 300, and for performing other tasks mentioned herein. All of or a part of the processes, method and/or operations of the foregoing embodiments can be realized using computer hardware and computer programs executed thereon. In FIG. 7A, the computer system 700 is provided with a computer 701 including an optical disk read only memory (e.g., CD-ROM or DVD-ROM) drive 705 and a magnetic disk drive 706, a keyboard 702, a mouse 703, and a monitor 704.

Figure 7B:
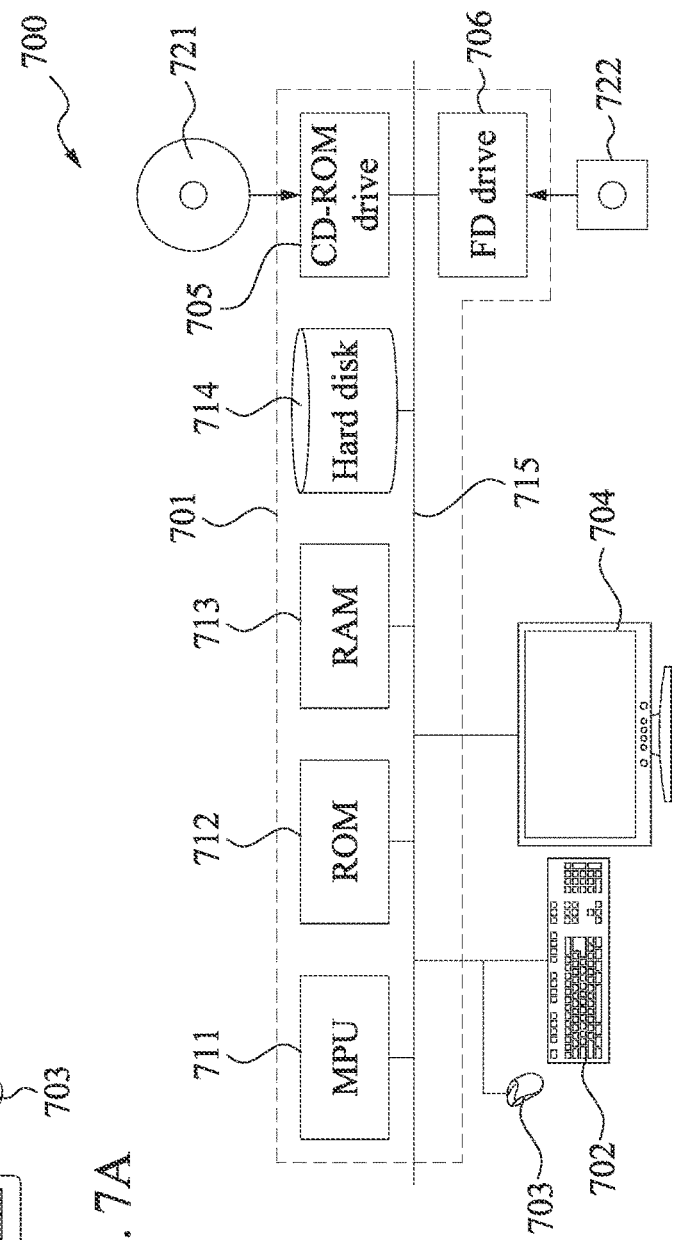

FIG. 7B is a diagram showing an internal configuration of the computer system 700. In FIG. 7B, the computer 701 is provided with, in addition to the optical disk drive 705 and the magnetic disk drive 706, one or more processors 711, such as a micro processing unit (MPU), a ROM 712 in which a program such as a boot up program is stored, a random access memory (RAM) 713 that is connected to the MPU 711 and in which a command of an application program is temporarily stored and a temporary storage area is provided, a hard disk 714 in which an application program, a system program, and data are stored, and a bus 715 that connects the MPU 711, the ROM 712, and the like. Note that the computer 701 may include a network card (not shown) for providing a connection to a LAN.

The program for causing the computer system 700 to execute the functions of the control system for controlling the dispensing of the resist material on a substrate in the foregoing embodiments may be stored in an optical disk 721 or a magnetic disk 722, which are inserted into the optical disk drive 705 or the magnetic disk drive 706, and transmitted to the hard disk 714. Alternatively, the program may be transmitted via a network (not shown) to the computer 701 and stored in the hard disk 714. At the time of execution, the program is loaded into the RAM 713. The program may be loaded from the optical disk 721 or the magnetic disk 722, or directly from a network. The program does not necessarily have to include, for example, an operating system (OS) or a third party program to cause the computer 701 to execute the functions of the control system for controlling an amount of energy delivered by an electron beam to a resist material in the foregoing embodiments. The program may only include a command portion to call an appropriate function (module) in a controlled mode and obtain desired results.

Figure 8:
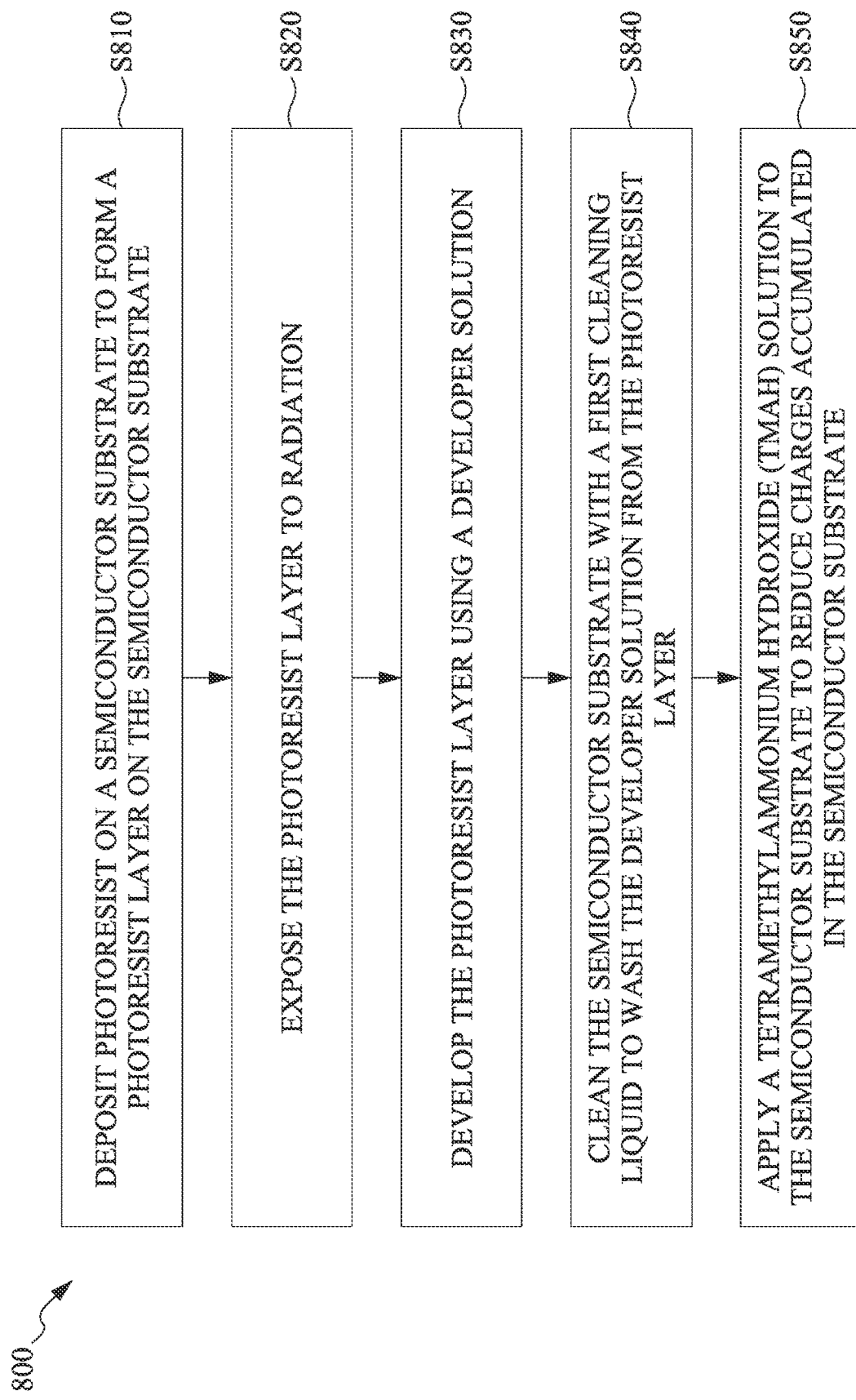
FIG. 8 illustrates a flow-chart of a method of minimizing electrostatic charges in a semiconductor substrate, in accordance with an embodiment of the present disclosure.

An embodiment of the present disclosure is a method 800 of minimizing electrostatic charges in a silicon-on-insulator (SOI) substrate according to the flowchart illustrated in FIG. 8. It is understood that additional operations can be provided before, during, and after processes discussed in FIG. 8, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S810 of depositing photoresist on a semiconductor substrate to form a photoresist layer on the semiconductor substrate. In some embodiments, the semiconductor substrate is a silicon-on-insulator (SOI) wafer. In operation S820, the photoresist layer is exposed to radiation. In some embodiments, the radiation includes ultraviolet (UV) radiation, a deep ultraviolet (DUV) radiation, an extreme ultraviolet (EUV) radiation, or an X-ray radiation. In operation S830, the photoresist layer is developed using a developer solution. In operation S840, the semiconductor substrate is cleaning with a first cleaning liquid to wash the developer solution from the photoresist layer. In some embodiments, the first cleaning solution includes deionized water. In operation S850, a tetramethylammonium hydroxide (TMAH) solution is applied to the semiconductor substrate to reduce charges accumulated in the semiconductor substrate. In some embodiments, the semiconductor substrate is spin-dried after cleaning the semiconductor substrate with the first cleaning liquid. In some embodiments, the semiconductor substrate is spin-dried after applying the tetramethylammonium hydroxide (TMAH) solution. In some embodiments, the TMAH solution is a 2.38% tetramethylammonium hydroxide (TMAH) solution. In some embodiments, the semiconductor substrate is cleaned again with a second cleaning liquid.

Figure 9:
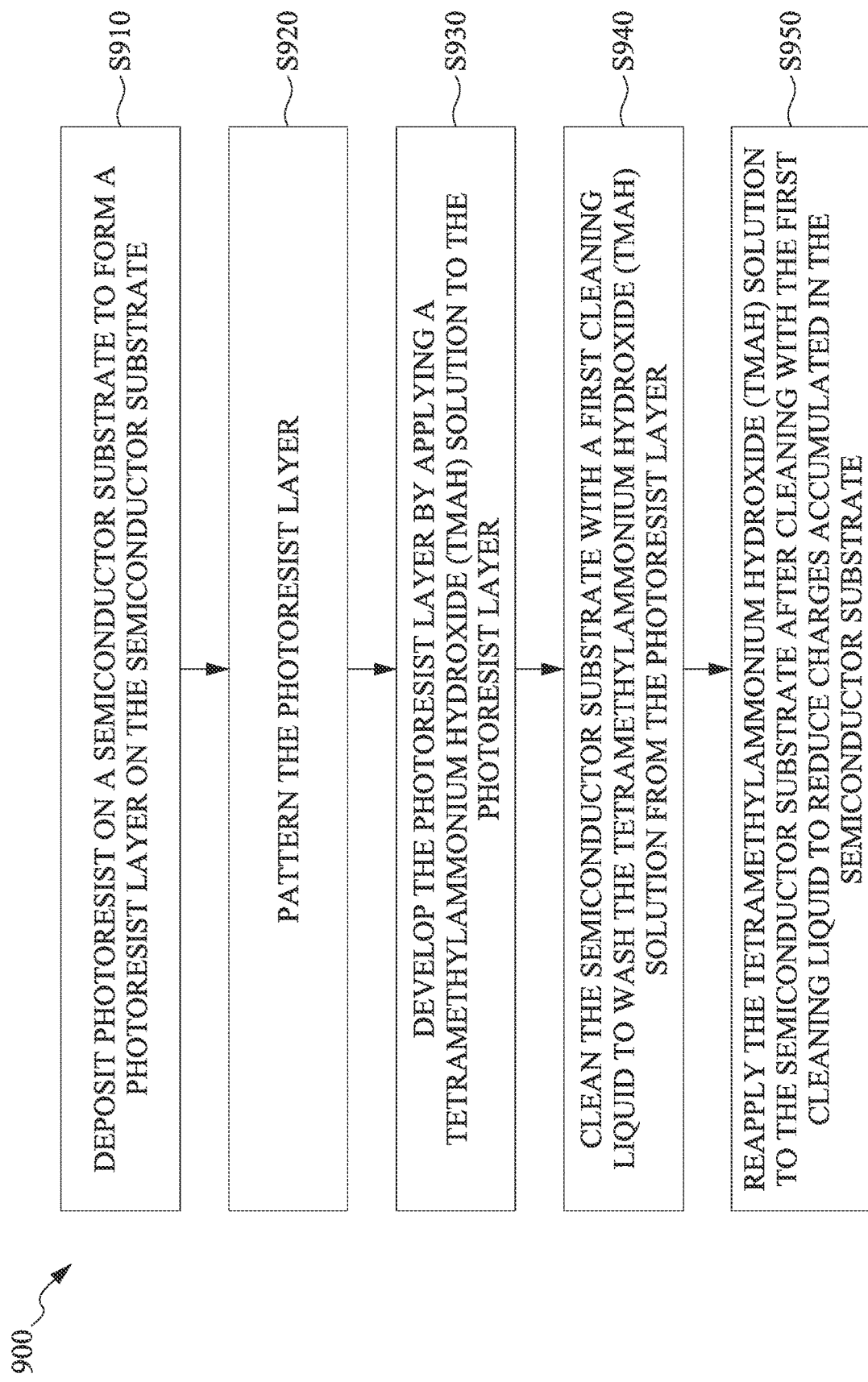
FIG. 9 illustrates a flow-chart of a method of minimizing electrostatic charges in a semiconductor substrate, in accordance with an embodiment of the present disclosure.

Another embodiment of the present disclosure is a method 900 of minimizing electrostatic charges in a silicon-on-insulator (SOI) substrate according to the flowchart illustrated in FIG. 9. It is understood that additional operations can be provided before, during, and after processes discussed in FIG. 9, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S910 of depositing photoresist on a semiconductor substrate to form a photoresist layer on the semiconductor substrate. In operation S920, the photoresist layer is patterned. In operation S930, the photoresist layer is developed by applying a tetramethylammonium hydroxide (TMAH) solution to the photoresist layer. In operation S940, the semiconductor substrate is cleaning with a first cleaning liquid to wash the tetramethylammonium hydroxide (TMAH) solution from the photoresist layer. In operation S950, the tetramethylammonium hydroxide (TMAH) solution is reapplied to the semiconductor substrate after cleaning with the first cleaning solution to reduce charges accumulated in the semiconductor substrate.

Figure 10:
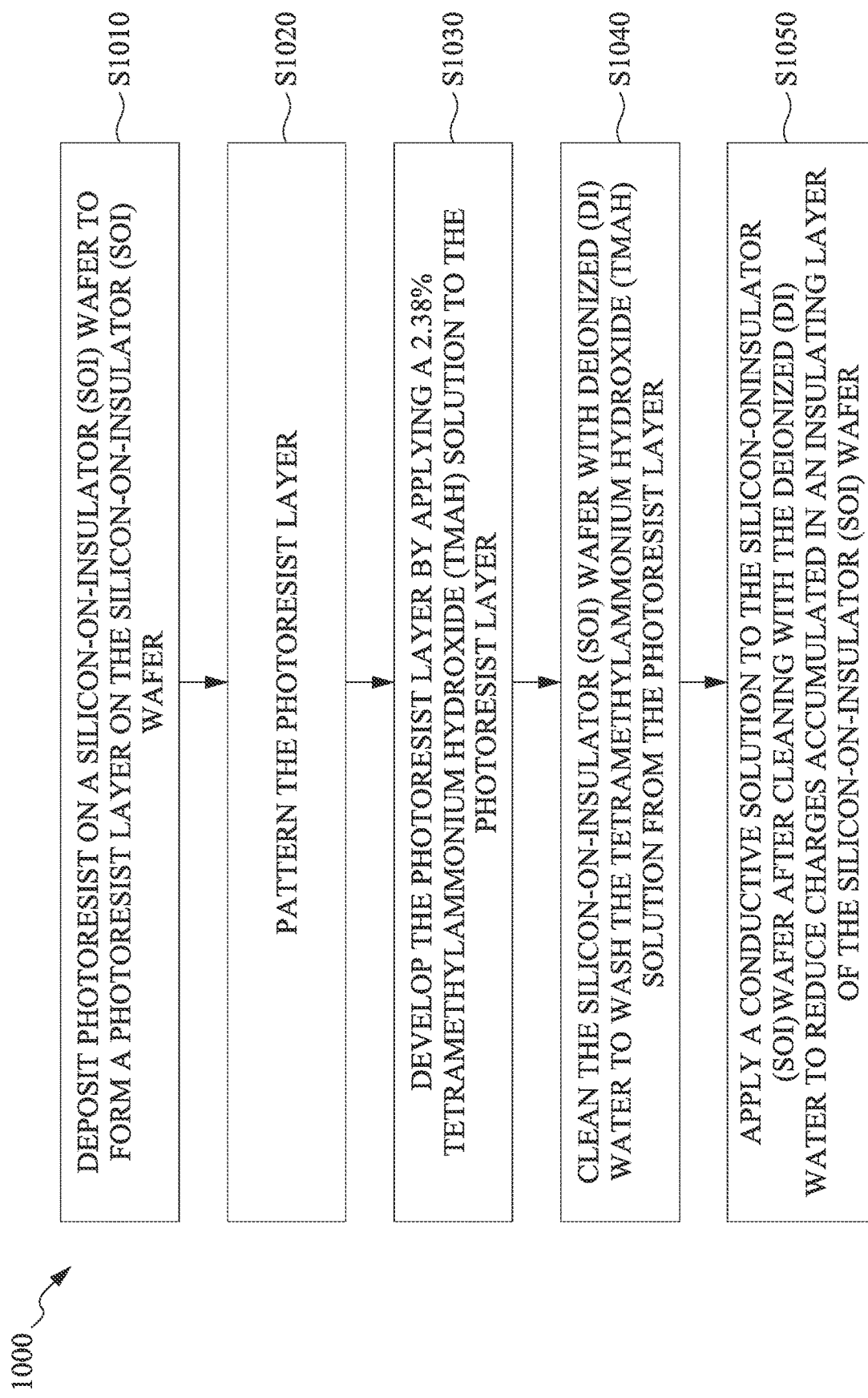
FIG. 10 illustrates a flow-chart of a method of minimizing electrostatic charges in a silicon-on-insulator (SOI) substrate, in accordance with an embodiment of the present disclosure

Another embodiment of the present disclosure is a method 1000 of minimizing electrostatic charges in a silicon-on-insulator (all) substrate according to the flowchart illustrated in FIG. 10. It is understood that additional operations can be provided before, during, and after processes discussed in FIG. 10, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S1010 of depositing photoresist on a silicon-on-insulator (SOI) wafer to form a photoresist layer on the silicon-on-insulator (SOI) wafer. In operation S1020, the photoresist layer is patterned. In operation S1030, the photoresist layer is developed by applying a 2.38% tetramethylammonium hydroxide (TMAH) solution to the photoresist layer. In operation S1040, the silicon-on-insulator (SOI) wafer is cleaned with deionized (DI) water to wash the tetramethylammonium hydroxide (TMAH) solution from the photoresist layer. In operation S1050, a conductive solution is applied to the silicon-on-insulator (SOI) wafer after cleaning with the deionized (DI) water to reduce charges accumulated in an insulating layer of the silicon-on-insulator (SOI) wafer.

According to one aspect of the present disclosure, a method includes depositing photoresist on a semiconductor substrate to form a photoresist layer on the semiconductor substrate. The photoresist layer is exposed to radiation. The photoresist layer is developed using a developer solution. The semiconductor substrate is cleaned with a first cleaning liquid to wash the developer solution from the photoresist layer. A tetramethylammonium hydroxide (TMAH) solution is applied to the semiconductor substrate to reduce charges accumulated in the semiconductor substrate. In an embodiment, applying a 2.38% TMAH solution is applied to the semiconductor substrate. In an embodiment, the semiconductor substrate is spin-dried after cleaning the semiconductor substrate with the first cleaning liquid. In an embodiment, the first cleaning liquid includes deionized (DI) water. In an embodiment, the semiconductor substrate is spin-dried after applying the TMAH solution. In an embodiment, when spin-drying the semiconductor substrate after applying the TMAH solution, the semiconductor substrate is rotated at a rotational speed that is different from a rotational speed of the semiconductor substrate when spin-drying the semiconductor substrate after cleaning the semiconductor substrate with the first cleaning liquid. In an embodiment, the semiconductor substrate is rotated at a rotational speed of at least around 50 RPM for at least around 5 seconds. In an embodiment, the semiconductor substrate is a silicon-on-insulator (SOI) wafer, and the charges are accumulated in an insulating layer of the SOI wafer. In an embodiment, the semiconductor substrate is cleaned with a second cleaning liquid, and the semiconductor substrate is spin dried after cleaning the semiconductor substrate with the second cleaning liquid. In an embodiment, the semiconductor substrate is rotated at a rotational speed of at least around 50 RPM for at least around 10 seconds. In an embodiment, the second cleaning liquid and the first cleaning liquid are same. In an embodiment, the second cleaning liquid includes deionized (DI) water. In an embodiment, the photoresist layer is developed using a tetramethylammonium hydroxide (TMAH) solution.

According to yet another aspect of the present disclosure, a method includes depositing photoresist on a semiconductor substrate to form a photoresist layer on the semiconductor substrate. The photoresist layer is patterned. The photoresist layer is developed by applying a tetramethylammonium hydroxide (TMAH) solution to the photoresist layer. The semiconductor substrate is cleaned with a first cleaning liquid to wash the tetramethylammonium hydroxide (TMAH) solution from the photoresist layer. The tetramethylammonium hydroxide (TMAH) solution is reapplied to the semiconductor substrate after cleaning with the first cleaning liquid to reduce charges accumulated in the semiconductor substrate. In an embodiment, the semiconductor substrate is spin-dried after cleaning the semiconductor substrate with the first cleaning liquid. In an embodiment, a second cleaning liquid is applied to the semiconductor substrate after reapplying the tetramethylammonium hydroxide (TMAH) solution. In an embodiment, the semiconductor substrate is spin-dried after applying the second cleaning liquid.

According to another aspect of the present disclosure, a method includes depositing photoresist on a silicon-on-insulator (SOI) wafer to form a photoresist layer on the silicon-on-insulator (SOI) wafer. The photoresist layer is patterned. The photoresist layer is developed by applying a 2.38% tetramethylammonium hydroxide (TMAH) solution to the photoresist layer. The silicon-on-insulator (SOI) wafer is cleaned with deionized (DI) water to wash the tetramethylammonium hydroxide (TMAH) solution from the photoresist layer. A conductive solution is applied to the silicon-on-insulator (SOI) wafer after cleaning with the deionized (DI) water to reduce charges accumulated in an insulating layer of the silicon-on-insulator (SOI) wafer. In an embodiment, the silicon-on-insulator (SOI) wafer is spin-dried after cleaning the silicon-on-insulator (SOI) wafer using the deionized (DI) water. In an embodiment, the silicon-on-insulator (SOI) wafer is cleaned with the deionized (DI) water after applying the conductive solution to the silicon-on-insulator (SOI) wafer. In an embodiment, the silicon-on-insulator (SOI) wafer is spin-dried after cleaning the silicon-on-insulator (SOI) wafer with the deionized (DI) water.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing photoresist on a semiconductor substrate to form a photoresist layer on the semiconductor substrate;
exposing the photoresist layer to radiation;
developing the photoresist layer using a tetramethylammonium hydroxide (TMAH) solution;
cleaning the semiconductor substrate by rotating the semiconductor substrate at a first rotational speed while applying a first cleaning liquid to wash the tetramethylammonium hydroxide (TMAH) solution from the photoresist layer; and
reapplying the tetramethylammonium hydroxide (TMAH) solution to the semiconductor substrate while rotating the semiconductor substrate at a second rotational speed to reduce charges accumulated in the semiconductor substrate.

2. The method of claim 1, wherein reapplying the TMAH solution to the semiconductor substrate includes applying a 2.38% TMAH solution to the semiconductor substrate.

3. The method of claim 1, further comprising spin-drying the semiconductor substrate after cleaning the semiconductor substrate with the first cleaning liquid.

4. The method of claim 1, wherein the first rotational speed is different from the second rotational speed.

5. The method of claim 4, wherein the second rotational speed is around 50 RPM.

6. The method of claim 4, wherein the second rotational speed is around 500 RPM.

7. The method of claim 4, wherein the second rotational speed is around 1000 RPM.

8. The method of claim 1, wherein the first cleaning liquid is deionized (DI) water.

9. The method of claim 8, further comprising recleaning the semiconductor substrate using the deionized (DI) water after reapplying the tetramethylammonium hydroxide (TMAH) solution to the semiconductor substrate.

10. The method of claim 5, further comprising spin-drying the semiconductor substrate at a third rotational speed that is less than first rotational speed.

11. The method of claim 10, wherein the third rotational speed is around 50 RPM and the semiconductor substrate is rotated for at least around 10 second.

12. The method of claim 1, wherein
the semiconductor substrate is a silicon-on-insulator (SOI) wafer, and the charges are accumulated in an insulating layer of the SOI wafer.

13. A method, comprising:
depositing photoresist on a semiconductor substrate to form a photoresist layer on the semiconductor substrate;
patterning the photoresist layer;
developing the photoresist layer by applying a tetramethylammonium hydroxide (TMAH) solution to the photoresist layer while rotating the semiconductor substrate at a first rotational speed, wherein rotating the semiconductor substrate generates charges in the semiconductor substrate;
applying deionized (DI) water to the semiconductor substrate while rotating the semiconductor substrate at a second rotational speed higher than the first rotational speed to wash the tetramethylammonium hydroxide (TMAH) solution from the photoresist layer, wherein rotating the semiconductor substrate at the second rotational speed increases the charges in the semiconductor substrate; and
reapplying the tetramethylammonium hydroxide (TMAH) solution to the semiconductor substrate after applying the deionized (DI) water to reduce the charges accumulated in the semiconductor substrate.

14. The method of claim 13, further comprising spin-drying the semiconductor substrate after washing the tetramethylammonium hydroxide (TMAH) using the deionized (DI) water.

15. The method of claim 14, further comprising reapplying the deionized (DI) water to the semiconductor substrate after reapplying the tetramethylammonium hydroxide (TMAH) solution.

16. The method of claim 15, further comprising spin-drying the semiconductor substrate after reapplying the deionized (DI) water.

17. A method, comprising:
depositing photoresist on a silicon-on-insulator (SOI) wafer to form a photoresist layer on the SOI wafer;
patterning the photoresist layer;
generating charges in the SOI wafer by applying a 2.38% tetramethylammonium hydroxide (TMAH) solution to the photoresist layer while rotating the SOI wafer at a first rotational speed;
rotating the SOI wafer at a second rotational speed higher than the first rotation speed to while applying deionized (DI) water to the SOI wafer to increase the charges in the SOI wafer; and
reducing the charges in the SOI wafer by reapplying the 2.38% tetramethylammonium hydroxide (TMAH) solution to the SOI wafer while rotating the SOI wafer at a third rotational speed less than the second rotational speed.

18. The method of claim 17, wherein the charges are accumulated in an insulating layer of the SOI wafer.

19. The method of claim 17, further comprising spin-drying the SOI wafer after applying the deionized (DI) water.

20. The method of claim 19, further comprising:
cleaning the SOI wafer with the deionized (DI) water after reapplying the 2.38% tetramethylammonium hydroxide (TMAH) solution to the SOI wafer.

* * * * *